(12) United States Patent
Liu (10) Patent No.: US 11,735,073 B2
(45) Date of Patent: Aug. 22, 2023

(54) METHOD FOR MAKING MICRO LED DISPLAY PANEL INCLUDING LIGHT EMITTING UNITS

(71) Applicant: HON HAI PRECISION INDUSTRY CO., LTD., New Taipei (TW)

(72) Inventor: Feng-Hsiang Liu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 88 days.

(21) Appl. No.: 17/479,158

(22) Filed: Sep. 20, 2021

(65) Prior Publication Data

US 2022/0005389 A1     Jan. 6, 2022

Related U.S. Application Data

(62) Division of application No. 16/421,821, filed on May 24, 2019, now Pat. No. 11,164,486.

(60) Provisional application No. 62/677,679, filed on May 30, 2018.

(51) Int. Cl.
| | |
|---|---|
| G09F 9/33 | (2006.01) |
| H01L 27/15 | (2006.01) |
| G09G 3/20 | (2006.01) |
| G09G 3/32 | (2016.01) |

(52) U.S. Cl.
CPC ............. *G09F 9/33* (2013.01); *G09G 3/2003* (2013.01); *G09G 3/32* (2013.01); *H01L 27/156* (2013.01)

(58) Field of Classification Search
CPC ..... H01L 27/156; H01L 25/0753; G09F 9/33; G09G 3/32; G02F 1/133603; G02F 1/1335
See application file for complete search history.

(56) References Cited

U.S. PATENT DOCUMENTS

| | | | |
|---|---|---|---|
| 2009/0078955 A1 | 3/2009 | Fan et al. | |
| 2017/0025075 A1* | 1/2017 | Cok | ..................... G09G 3/2003 |
| 2017/0141155 A1 | 5/2017 | Hughes et al. | |
| 2017/0179097 A1 | 6/2017 | Zhang et al. | |
| 2018/0040665 A1* | 2/2018 | Ohmae | ................... H01L 33/46 |
| 2018/0068987 A1 | 3/2018 | Cope | |

FOREIGN PATENT DOCUMENTS

| | | |
|---|---|---|
| CN | 106531759 A | 3/2017 |
| TW | 201733106 A | 9/2017 |

* cited by examiner

*Primary Examiner* — Selim U Ahmed
(74) *Attorney, Agent, or Firm* — ScienBiziP, P.C.

(57) ABSTRACT

A micro LED display panel capable of simpler but more precise manufacture by pre-loading micro LEDs onto wafers which are then transferred to a substrate includes the substrate and light-emitting units. Each light-emitting unit includes a wafer unit and at least two micro LEDs on the wafer unit. The display panel includes pixel regions, each pixel region including at least three adjacent sub-pixel regions. Each sub-pixel region has one micro LED therein. Each micro LED of the light-emitting units is located in one sub-pixel region and the micro LEDs in each pixel regions emit light of different colors.

5 Claims, 8 Drawing Sheets

METHOD FOR MAKING MICRO LED DISPLAY PANEL INCLUDING LIGHT EMITTING UNITS

CROSS-REFERENCE TO RELATED APPLICATIONS

This application is a divisional application of U.S. Ser. No. 16/421,821, filed May 24, 2019, the contents of which are hereby incorporated by reference. The patent application Ser. No. 16/421,821 in turn claims priority from U.S. Patent provisional Application No. 62/677,679 filed on May 30, 2018.

FIELD

The subject matter herein generally relates to a micro light emitting diode (LED) display panel and a method for making the micro LED display panel.

BACKGROUND

A micro LED display panel includes a plurality of pixels, wherein each pixel includes several sub-pixel regions. A method for making a micro LED display panel includes transferring a plurality of micro LEDs emitting light of different colors into sub-pixel regions on a substrate. The micro LEDs in each pixel are mounted on the substrate by multiple transfers. Since a size of the micro LED is small, accurate transfers of the micro LEDs may be problematic. As a number of transfers increases, a yield of successful micro LED display panels decreases.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like. The term "micro LED" herein refers to an LED having a size of less than or equal to 100 micrometers (for example more than 10 micrometers and less than 100 micrometers).

First Embodiment

Figure 1:
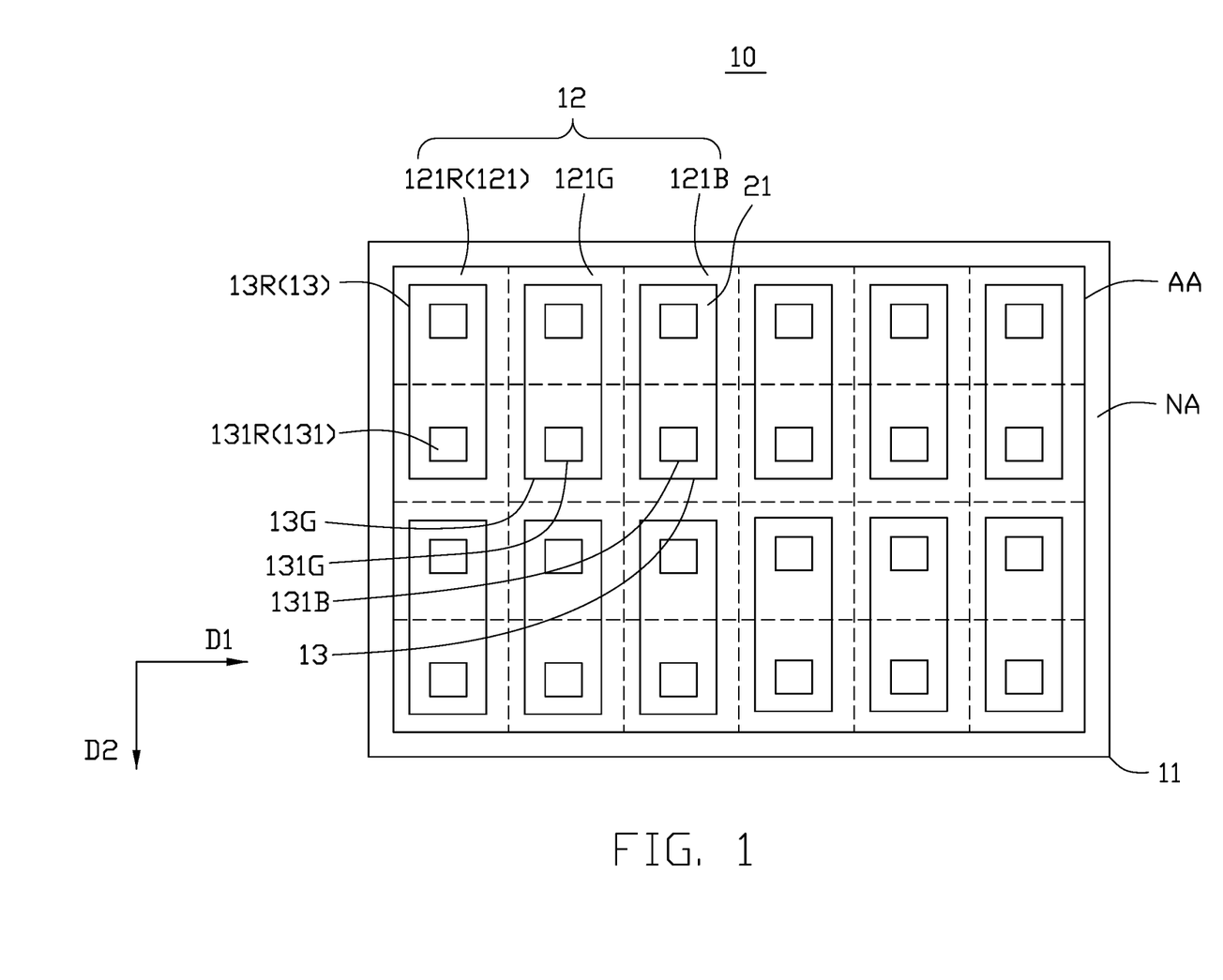
FIG. 1 is a planar view of a micro LED display panel of a first embodiment.

FIG. 1 illustrates a micro LED display panel 10 that uses micro LEDs 131 as a light source to realize the display of images. The micro LED display panel 10 includes a substrate 11 and a plurality micro LEDs 131 on the substrate 11. The micro LED display panel 10 includes a display area AA for displaying images and a non-display area NA surrounding the display area AA. An array of pixel regions 12 is defined in the display area AA. Each of the pixel regions 12 serves as a minimum independent full color display area, and all of the pixel areas 12 independently display to form a complete image of a frame. Further, each pixel region 12 includes several sub-pixel regions 121. In this embodiment, one pixel region 12 includes three sub-pixel regions which are a sub-pixel region 121R, a sub-pixel region 121G, and a sub-pixel region 121B. The sub-pixel region 121R emits red light, the sub-pixel region 121G emits green light, and the sub-pixel region 121B emits blue light.

One micro LED 131 is located in each sub-pixel region 121. Since the sub-pixel regions 121 in one pixel region 12 need to emit light of different colors, the micro LEDs 131 in each of the pixel regions 12 emit light of different colors. In this embodiment, in one pixel region 12, the sub-pixel region 121R is provided with a micro LED 131R emitting red light; the sub-pixel region 121G is provided with a micro LED 131G emitting green light; and the sub-pixel region 121B is provided with a micro LED 131B emitting blue light.

For all of the micro LEDs 131 in one pixel region 12, at least one micro LED 131 and another micro LED 131 in the same pixel region 12 or in an adjacent pixel region 12 belong to a light-emitting unit 13. That is, adjacent micro LEDs 131 share a common wafer and form one light-emitting unit 13. All of the micro LEDs 131 in one pixel region 12 may belong to one light-emitting unit 13 or to different light-emitting units 13.

The light-emitting units 13 are formed and transferred into the sub-pixel regions 121. Each light-emitting unit 13 includes at least two micro LEDs 131. Each micro LED 131 in one light-emitting unit 13 can emit light of a same color or light of different colors.

Figure 2:
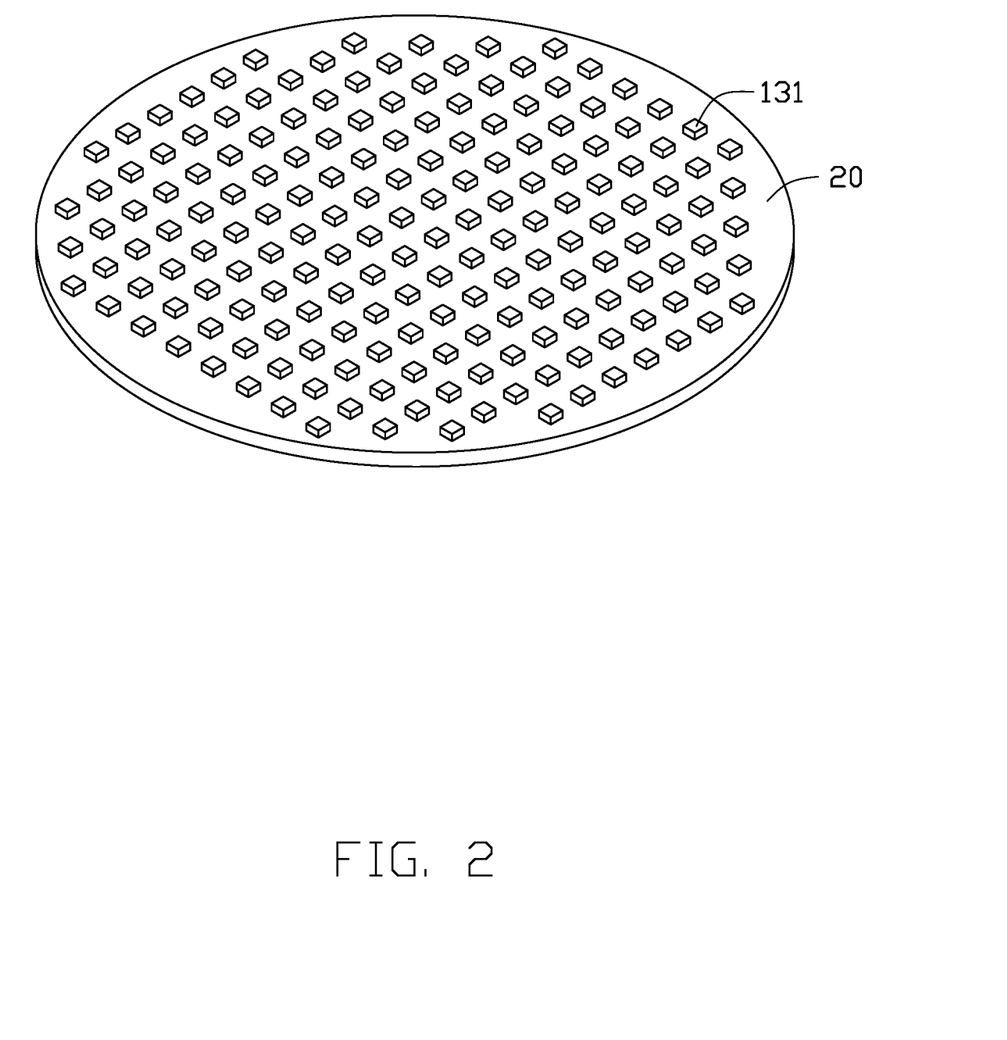
FIG. 2 is an isometric view of a substrate with a plurality of micro LEDs.

Referring to FIG. 2, in this embodiment, the micro LEDs 131 are formed on a wafer 20. A plurality of cut wafer units 21 form a wafer 20, creating a plurality of light-emitting units 13 independent from each other. The light-emitting units 13 are then transferred into the display area AA on the substrate 11 of the Micro-LED display panel 10, each of the light-emitting units 13 occupying at least two adjacent sub-pixel regions 121. A number of sub-pixel regions 121 occupied by one of the light-emitting units 13 is equal to a number of micro LEDs 131 in the light-emitting unit 13. The micro LEDs 131 in one light emitting unit 13 share one single wafer unit 21. Each light emitting unit 13 includes a wafer unit 21 and at least two micro LEDs 131 on the wafer unit 21.

All of the micro LEDs 131 in a light-emitting unit 13 on the substrate 11 emit light of a same color, and some of the light-emitting units 13 include same number of micro LEDs 131.

Referring to FIG. 1, in the present embodiment, each light-emitting unit 13 on the substrate 11 includes same number of micro LEDs 131. In each light-emitting unit 13, the micro LEDs 131 emit light of a same color.

As shown in FIG. 1, three adjacent sub-pixel regions 121 in a first direction D1 form one pixel region 12. FIG. 1 shows a plurality of light-emitting units 13 on the substrate 11 and the light-emitting units 13 include a plurality of first light-emitting units 13R, a plurality of second light-emitting units 13G, and a plurality of third light-emitting units 13B. The light-emitting units 13 are arranged in an array. Each light emitting unit 13 includes two micro LEDs 131 and occupies adjacent sub-pixel regions 121. Each light emitting unit 13 is shared by adjacent pixel regions 12 in a second direction D2. The second direction D2 is perpendicular to the first direction D1. The two LEDs 131 of each first light unit 13R emit red light, the two LEDs 131 of each second light unit 13G emit green light, and the two LEDs 131 of each third light unit 13B emit blue light. Thus, one micro LED 131R which emits red light, one micro LED 131G which emits green light, and one micro LED 131B which emits blue light are disposed in the three sub-pixel regions 121 of each pixel region 12.

In other embodiments, each light emitting unit 13 may include micro LEDs 131 of three or other number. An arrangement of such light emitting units 13 is similar to the above described, and details are not described herein again.

In other embodiments, all of the micro LEDs 131 in each light-emitting unit 13 emit light of a same color, but different light-emitting units 13 may include different numbers of micro LEDs 131.

The micro-LED display panel 10 of the present embodiment includes a substrate 11 and a plurality of light-emitting units 13 disposed on the substrate 11. The micro-LED display panel 10 defines a plurality of sub-pixel regions 121 in an array. Each light-emitting unit 13 includes at least two micro LEDs 131. Each micro LED 131 is located in one sub-pixel region 121. During the manufacturing process, the micro LEDs 131 need to be transferred to the substrate 11 in a one-to-one correspondence with the sub-pixel regions 121. All of the micro LEDs 131 in one light-emitting unit 13 are formed on a single wafer 20.

Second Embodiment

Figure 3:
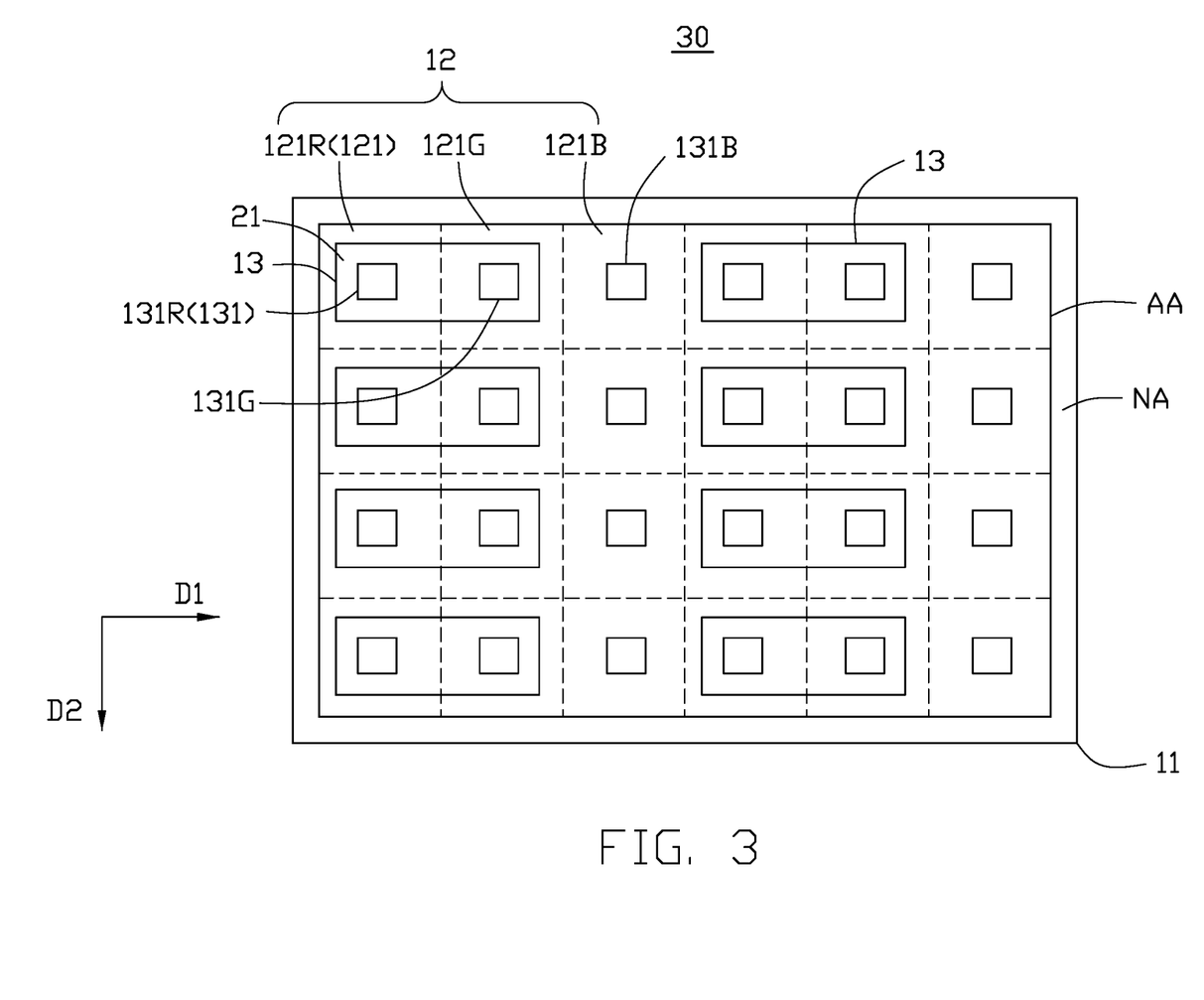
FIG. 3 is a planar view of a micro LED display panel of a second embodiment.

FIG. 3 illustrates a micro-LED display panel 30 of a second embodiment. The micro-LED display panel 30 includes a plurality of sub-pixel regions 121 arranged in an array and three adjacent sub-pixel regions 121 in a first direction D1 form one pixel region 12.

FIG. 3 shows eight light-emitting units 13 on the substrate 11. Each light-emitting unit 13 includes two micro LEDs 131, the two micro LEDs 131 emit light of different colors. Each light-emitting unit 13 is transferred onto the substrate 11 and occupies two sub-pixel regions 121.

In the second embodiment, the two micro LEDs 131 in each light-emitting unit 13 are specifically one of micro LED 131R emitting red light and one of micro LED 131G emitting green light. The micro LED 131R and the micro LED 131G in each light-emitting unit 13 occupy adjacent sub-pixel regions 121 in one pixel region 12, and one micro LED 131B emitting blue light is located in the remaining one sub-pixel region 121 in one pixel region 12.

In other embodiments, the two micro LEDs 131 in each light-emitting unit 13 can also be one of micro LED 131R emitting red light and one of micro LED 131B emitting blue light. Alternatively, the two micro LEDs 131 in each light-emitting unit 13 can also be one micro LED 131B emitting blue light and one micro LED 131G emitting green light.

Third Embodiment

Figure 4:
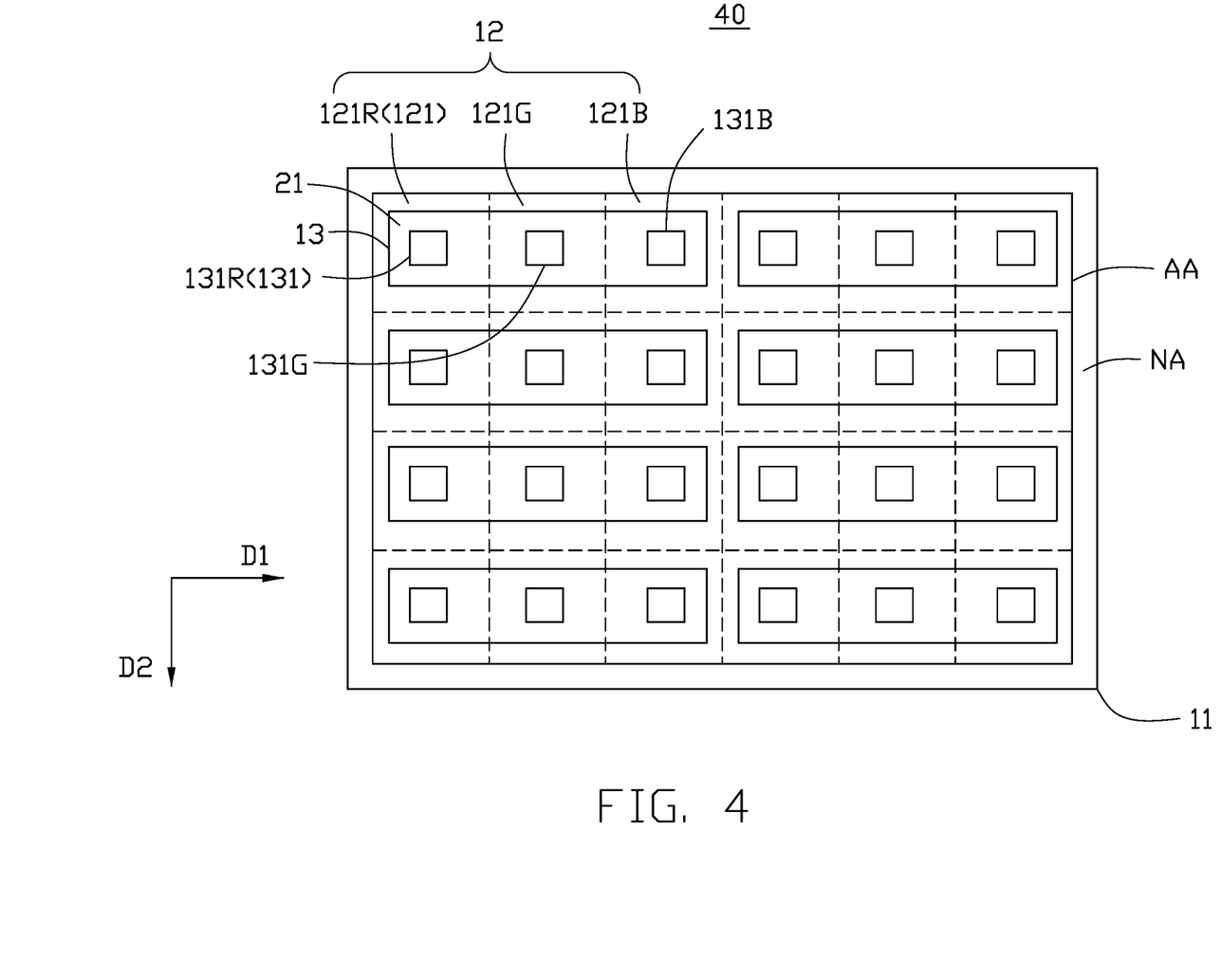
FIG. 4 is a planar view of a micro LED display panel of a third embodiment.

FIG. 4 illustrates a micro-LED display panel 40 of a third embodiment. The micro-LED display panel 40 also includes a plurality of sub-pixel regions 121 arranged in an array; and three adjacent sub-pixel regions 121 in a first direction D1 form one pixel region 12.

FIG. 4 shows eight light-emitting units 13 on the substrate 11. Each light-emitting unit 13 includes three micro LEDs 131 and each of the three micro LEDs 131 emits light of a different color. Each light-emitting unit 13 is transferred onto the substrate 11 and occupies three adjacent sub-pixel regions 121 of one pixel region 12.

As shown in FIG. 4, the three micro LEDs 131 in each light-emitting unit 13 are one micro LED 131R emitting red light, one micro LED 131G emitting green light, and one micro LED 131B emitting blue light.

Fourth Embodiment

Figure 5:
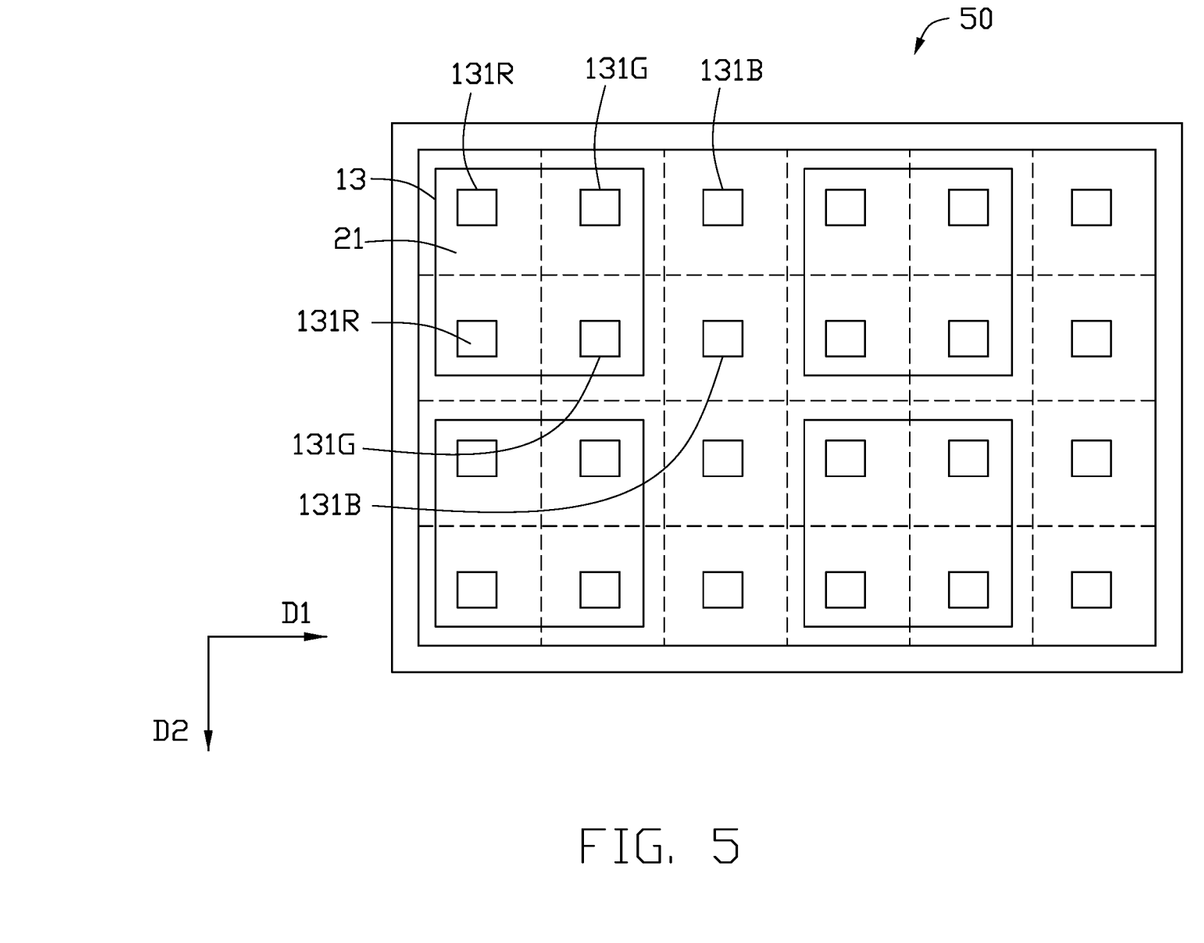
FIG. 5 is a planar view of a micro LED display panel of a fourth embodiment.

FIG. 5 illustrates a micro-LED display panel 50 of a fourth embodiment. The micro-LED display panel 50 includes a plurality of sub-pixel regions 121 arranged in an array and three adjacent sub-pixel regions 121 in a first direction D1 form one pixel region 12.

FIG. 5 shows four light-emitting units 13 on the substrate 11. Each light-emitting unit 13 includes four micro LEDs 131, the four micro LEDs 131 emit light of two colors. Each light-emitting unit 13 is transferred onto the substrate 11 and occupies four sub-pixel regions 121. Each light-emitting unit 13 is located in adjacent pixel regions 12 along the second direction D2.

In the present embodiment, the four micro LEDs 131 in each light-emitting unit 13 are two micro LEDs 131R emitting red light and two micro LED 131G emitting green light. One of the two micro LEDs 131R and an adjacent micro LED 131G in each light-emitting unit 13 occupy adjacent sub-pixel regions 121 in one pixel region 12. The other micro LED 131R and the other micro LED 131G in each light-emitting unit 13 occupy adjacent sub-pixel regions 121 in other one pixel region 12. One micro LED 131B emitting blue light is located in the remaining one sub-pixel region 121 in each pixel region 12.

In other embodiments, the four micro LEDs 131 in each light-emitting unit 13 can also be two micro LEDs 131R emitting red light and two micro LEDs 131B emitting blue light. Alternatively, the four micro LEDs 131 in each light-emitting unit 13 can also be two micro LEDs 131B emitting blue light and two micro LEDs 131G emitting green light.

Fifth Embodiment

Figure 6:
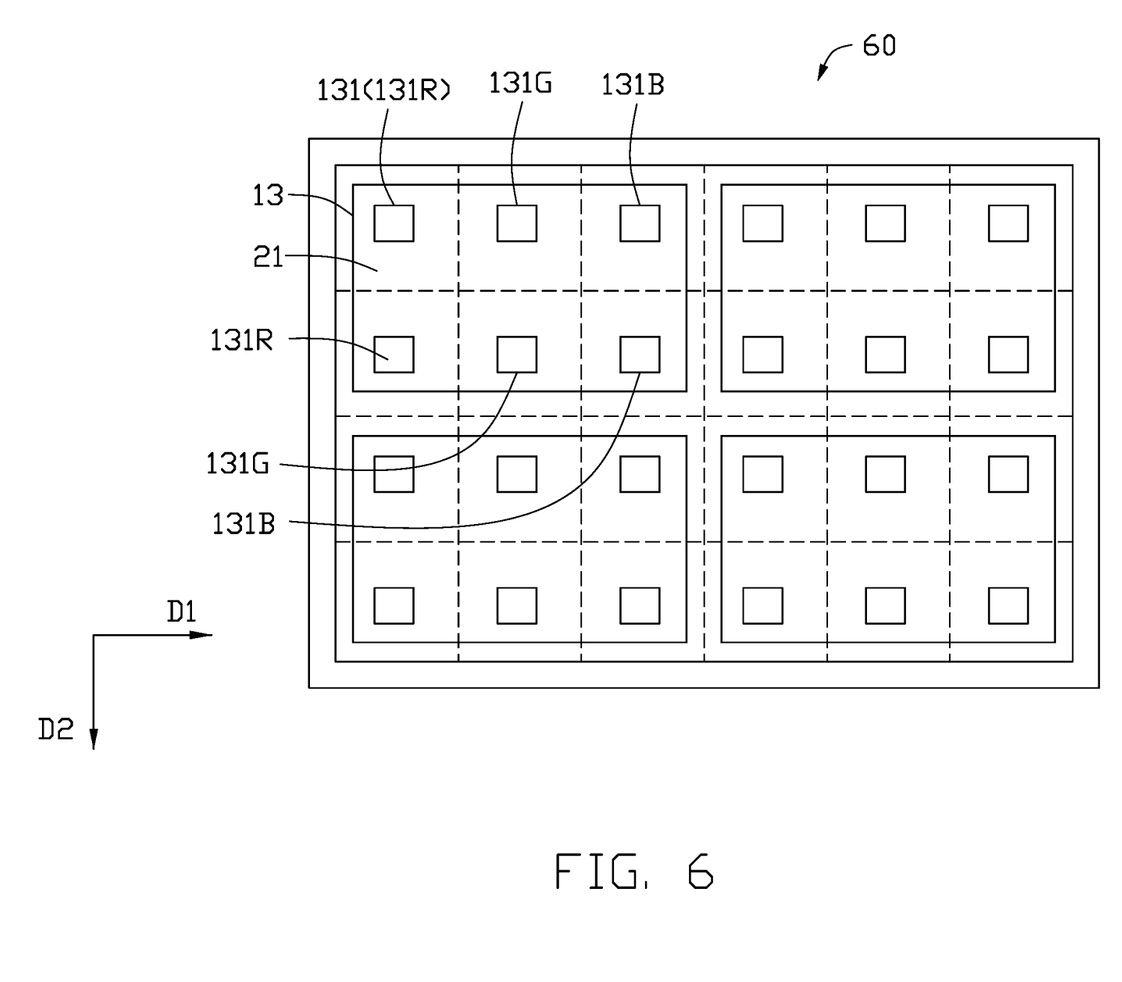
FIG. 6 is a planar view of a micro LED display panel of a fifth embodiment.

FIG. 6 illustrates a micro-LED display panel 60 of a fifth embodiment. The micro-LED display panel 60 also includes a plurality of sub-pixel regions 121 arranged in an array and three adjacent sub-pixel regions 121 in a first direction D1 form one pixel region 12.

FIG. 6 shows four light-emitting units 13 on the substrate 11. Each light-emitting unit 13 includes six micro LEDs 131 and the six micro LEDs 131 emit light of three colors. Each light-emitting unit 13 is transferred onto the substrate 11 and occupies all of the sub-pixel regions 121 of two pixel regions 12.

As shown in FIG. 6, the six micro LEDs 131 in each light-emitting unit 13 are two micro LEDs 131R emitting red light, two micro LEDs 131G emitting green light, and two micro LEDs 131B emitting blue light.

Sixth Embodiment

Figure 7:
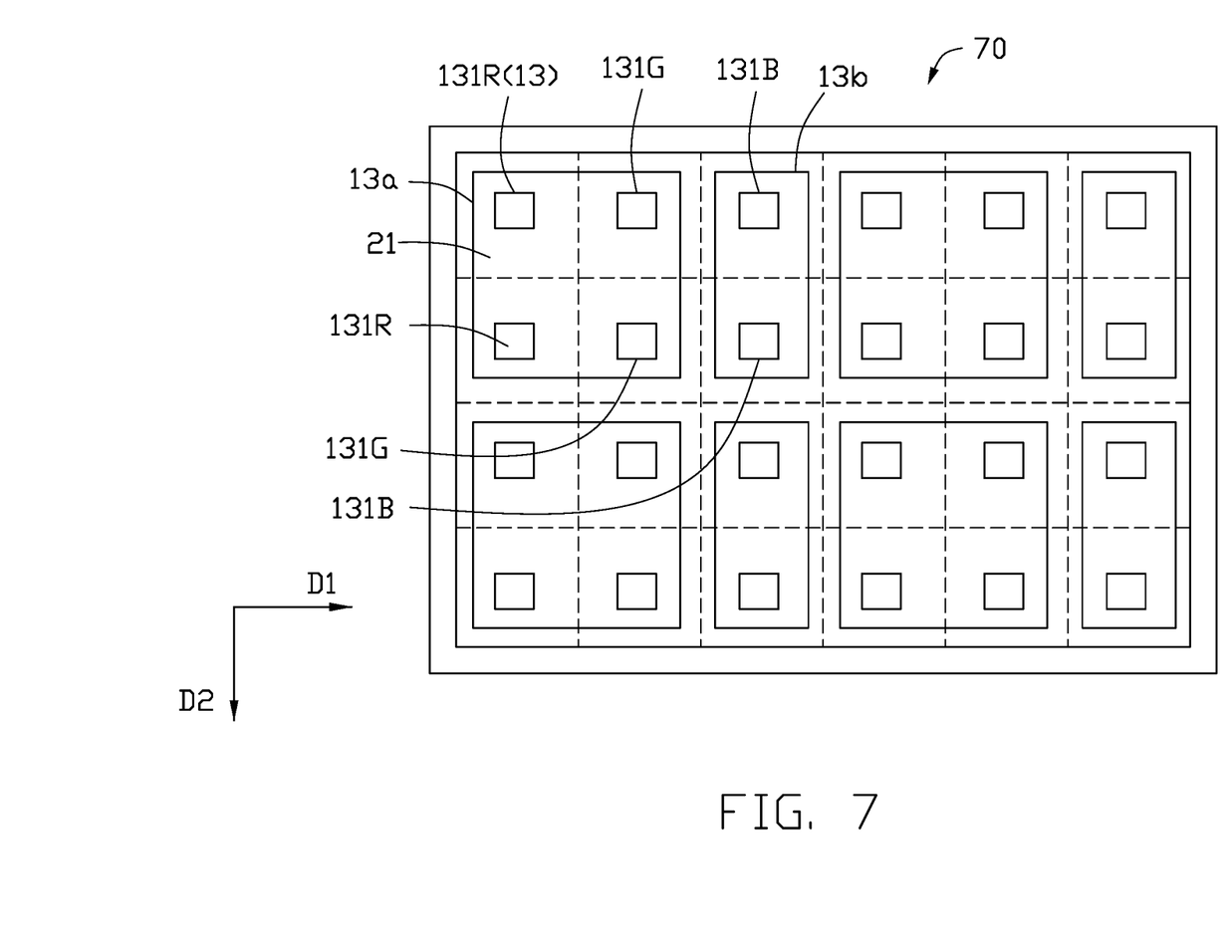
FIG. 7 is a planar view of a micro LED display panel of a sixth embodiment.

FIG. 7 illustrates a micro-LED display panel 70 of a sixth embodiment. The micro-LED display panel 70 also includes a plurality of sub-pixel regions 121 arranged in an array and three adjacent sub-pixel regions 121 in a first direction D1 form one pixel region 12.

FIG. 7 shows a plurality of light-emitting units 13 on the substrate 11. The eight light-emitting units 13 are a plurality of first light-emitting units 13a and a plurality of second light-emitting units 13b. Each first light-emitting unit 13a includes four micro LEDs 131 emitting light of two colors. Each first light-emitting unit 13a is transferred onto the substrate 11 and occupies four sub-pixel regions 121 of two pixel regions 12. Each second light-emitting unit 13b includes two micro LEDs 131 emitting a same color light. Each second light-emitting unit 13b is transferred onto the substrate 11 and occupies two sub-pixel regions 121 of two pixel regions 12. Each first light-emitting unit 13a and one adjacent second light-emitting unit 13b occupies all of the sub-pixel regions 121 of two adjacent pixel regions 12.

As shown in FIG. 7, the four micro LEDs 131 in each first light-emitting unit 13a are two micro LEDs 131R emitting red light and two micro LEDs 131G emitting green light. The two micro LEDs 131 in each second light-emitting unit 13b are two micro LEDs 131B emitting blue light.

In other embodiments, the four micro LEDs 131 in each first light-emitting unit 13a can also be two micro LEDs 131R emitting red light and two micro LEDs 131B emitting blue light; and the two micro LEDs 131 in each second light-emitting unit 13b are two micro LEDs 131G emitting green light. Alternatively, the four micro LEDs 131 in each first light-emitting unit 13a can also be two micro LEDs 131B emitting blue light and two micro LEDs 131G emitting green light; and the two micro LEDs 131 in each second light-emitting unit 13b are two micro LEDs 131R emitting red light.

The light-emitting units 13 described in the above embodiments can also be combined into one single micro-LED display panel.

Figure 8:
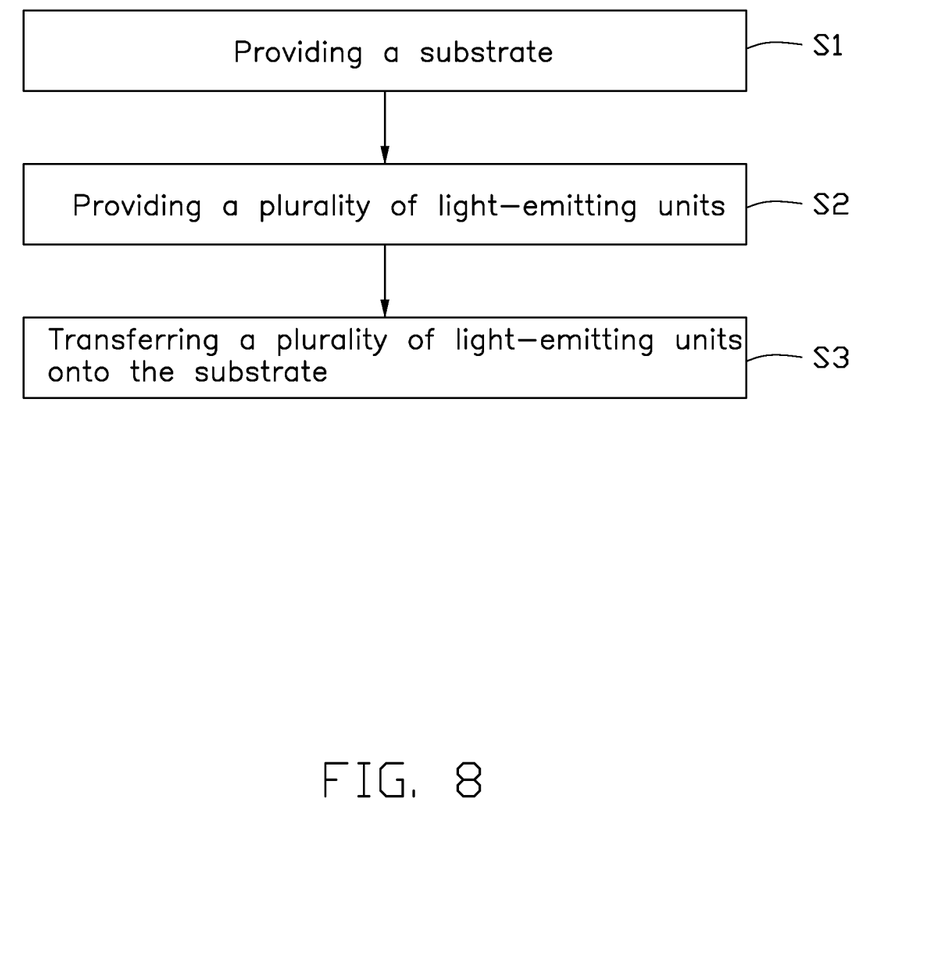
FIG. 8 is a flowchart of a method for making the micro LED display panel.

FIG. 8 illustrates a flowchart of a method for making a micro LED display panel. The example method is provided by way of example, as there are a variety of ways to carry out the method. Each block shown in FIG. 1 represents one or more processes, methods, or subroutines, carried out in the exemplary method. Furthermore, the illustrated order of blocks is by example only and the order of the blocks can be changed. The exemplary method can begin at block S1 according to the present disclosure. Depending on the embodiment, additional steps can be added, others removed, and the ordering of the steps can be changed.

At block S1, a substrate 11 is provided.

At block S2, a plurality of light-emitting units 13 is provided.

As described above, each light-emitting unit 13 includes a wafer unit 21 and at least two micro LEDs 131 on the wafer unit 21.

At block S3, the plurality of light-emitting units 13 are transferred onto the substrate 11.

The micro LED display panel includes a plurality of pixel region 12. Each pixel region 12 is divided into at least three sub-pixel regions 121. After the light-emitting units 13 have been transferred onto the substrate 11, each sub-pixel region 121 has one micro LED 131 located therein, and all of the micro LEDs 131 of one pixel region 12 emit light of different colors.

In one embodiment, there are only light-emitting units 13 on the substrate 11. That is, the micro LED 131 in each of the sub-pixel regions 121 belongs to one light-emitting unit 13. In other embodiments, there are both light-emitting units 13 and independent micro LEDs 131 that do not belong to any light-emitting units 13 on the substrate 11.

The method for making the micro-LED display panel in this disclosure can transfer at least two micro LEDs 131 onto the substrate 11 at a same time, which is beneficial to improving the production efficiency of the display panel.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for making a micro light emitting diode (LED) display panel, comprising:
   providing a substrate;
   providing a plurality of light-emitting units, each of the plurality of light-emitting units comprising a wafer unit and at least two micro LEDs on the wafer unit; and
   transferring the plurality of light-emitting units onto the substrate, the micro LED display panel defining a plurality of sub-pixel regions; each of the at least two micro LEDs of the plurality of light-emitting units being located in one of the plurality of sub-pixel regions;
   wherein the plurality of light-emitting units is provided with a plurality of first light-emitting units and a plurality of second light-emitting units; each of the plurality of first light-emitting units is provided with four or more of the micro LEDs emitting light of two first colors; each of the plurality of second light-emitting units is provided with two or more of the micro LEDs emitting light of a second color that is different from the two first colors of the plurality of first light-emitting units; the two first colors are selected from red, green, and blue; and the second color of the plurality of second light-emitting units is a remaining color selected from red, green, and blue that is not emitted by the plurality of first light-emitting units.

2. The method of claim 1, wherein the plurality of sub-pixel regions is arranged in an array.

3. The method of claim 2, wherein the micro LED display panel defines a plurality of pixel regions; each of the plurality of pixel regions is provided with three of the plurality of sub-pixel regions adjacent to each other; and each of the plurality of pixel regions is provided with the micro LEDs emitting light of different colors.

4. The method of claim 3, wherein each of the plurality of pixel regions is provided with three of the plurality of sub-pixel regions in a first direction;

each of the plurality of first light-emitting units is provided with only four of the micro LEDs emitting light of the two first colors;

each of the plurality of second light-emitting units is provided with only two of the micro LEDs emitting light of the second color that is different from the two first colors of the plurality of first light-emitting units;

an area of two adjacent pixel regions of the plurality of pixel regions in a second direction is provided with only one of the plurality of first light-emitting units and one of the plurality of second light-emitting units;

each of the plurality of first light-emitting units occupies four of the plurality of sub-pixel regions of two adjacent pixel regions of the plurality of pixel regions in a second direction;

each of the plurality of second light-emitting units occupies two of the plurality of sub-pixel regions of two adjacent pixel regions of the plurality of pixel regions in the second direction; and the second direction is perpendicular to the first direction.

5. The method of claim 4, wherein the micro LED display panel is provided with first columns of the plurality of first light-emitting units extending in the second direction and second columns of the plurality of second light-emitting units extending in the second direction; and in the first direction, each of the first columns of the plurality of first light-emitting units alternates with one of the second columns of the plurality of second light-emitting units.

* * * * *